United States Patent
Auburger et al.

(10) Patent No.: US 7,056,764 B2
(45) Date of Patent: Jun. 6, 2006

(54) ELECTRONIC SENSOR DEVICE AND METHOD FOR PRODUCING THE ELECTRONIC SENSOR DEVICE

(75) Inventors: Albert Auburger, Regenstauf (DE); Bernd Stadler, Donaustauf (DE); Stefan Paulus, Zeitlarn (DE); Horst Theuss, Wenzenbach (DE)

(73) Assignee: Infineon Technologies AG, Munich (DE)

( * ) Notice: Subject to any disclaimer, the term of this patent is extended or adjusted under 35 U.S.C. 154(b) by 385 days.

(21) Appl. No.: 10/238,820

(22) Filed: Sep. 10, 2002

(65) Prior Publication Data

US 2003/0052702 A1 Mar. 20, 2003

(30) Foreign Application Priority Data

Sep. 10, 2001 (DE) .......................... 101 44 467

(51) Int. Cl.
*H01L 21/44* (2006.01)
*G01R 31/308* (2006.01)

(52) U.S. Cl. ....................... 438/106; 324/753

(58) Field of Classification Search ................. 438/106, 438/118, 116, 108, 18; 257/678; 700/228; 324/753, 752, 751, 750, 537; 250/231.1, 250/227.21, 227.14
See application file for complete search history.

(56) References Cited

U.S. PATENT DOCUMENTS

| 5,495,450 | A | | 2/1996 | Zollo et al. |
| 6,119,052 | A | * | 9/2000 | Guenther et al. ............ 700/228 |
| 5,503,780 | A1 | * | 1/2003 | Glenn et al. ................. 438/116 |
| 6,617,674 | B1 | * | 9/2003 | Becker et al. ............... 257/678 |

FOREIGN PATENT DOCUMENTS

| JP | 63 296 252 A | 12/1988 |
| JP | 9-119875 | 5/1997 |
| JP | 09 304 211 A | 11/1997 |
| JP | 11 097 612 A | 4/1999 |
| JP | 2001 177 039 A | 6/2001 |

* cited by examiner

*Primary Examiner*—Craig A. Thompson
*Assistant Examiner*—Monica D Harrison
(74) *Attorney, Agent, or Firm*—Laurence A. Greenberg; Werner H. Stemer; Ralph E. Locher

(57) ABSTRACT

An electronic sensor device has at least one sensor component, which bears on a bearing base of a rewiring structure. Contact areas of the sensor component are electrically conductively connected to contact pads of the rewiring structure. External contact areas of the rewiring structure are led outward from a housing for the electrical contact-connection of the electronic sensor device. A method is also described for producing the electronic sensor device.

12 Claims, 3 Drawing Sheets

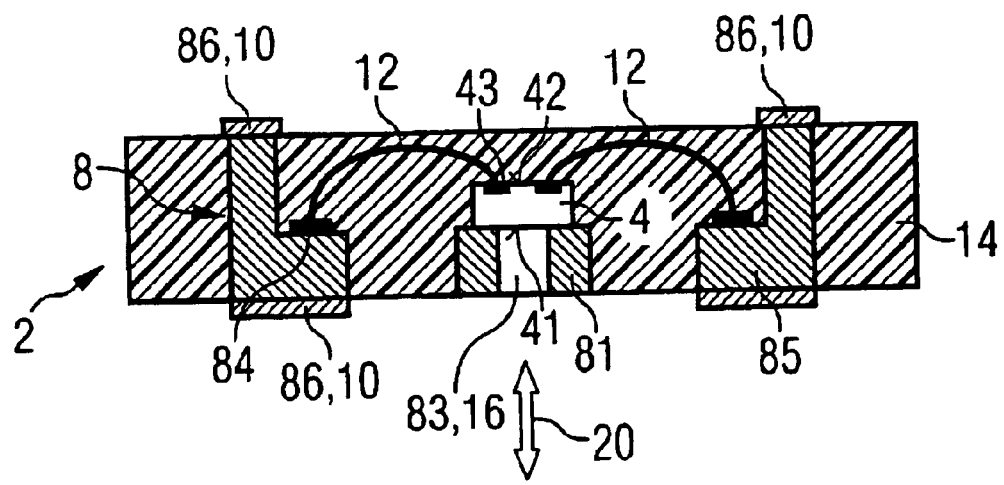
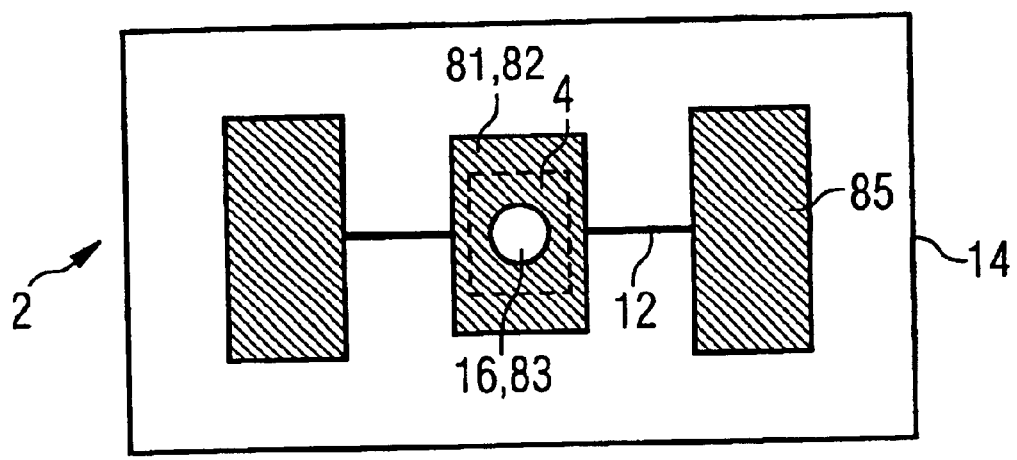

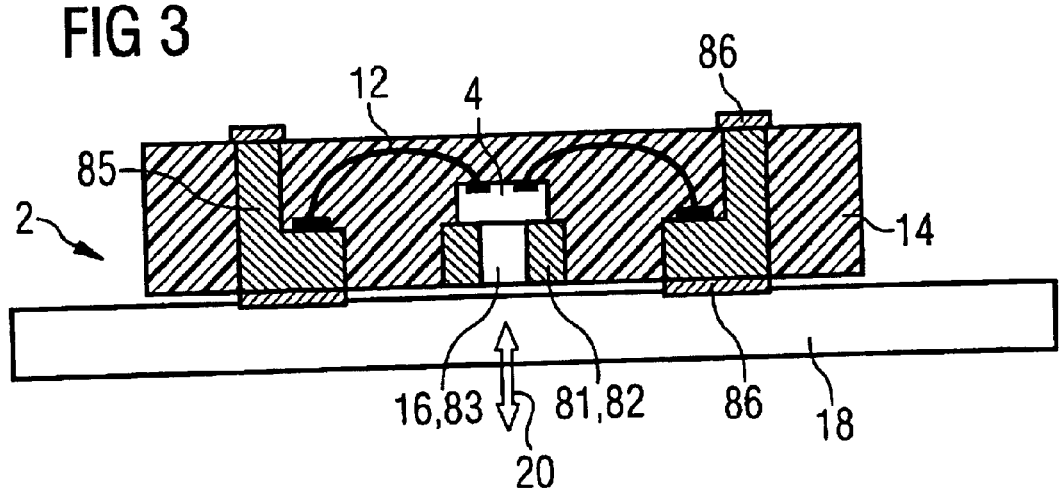
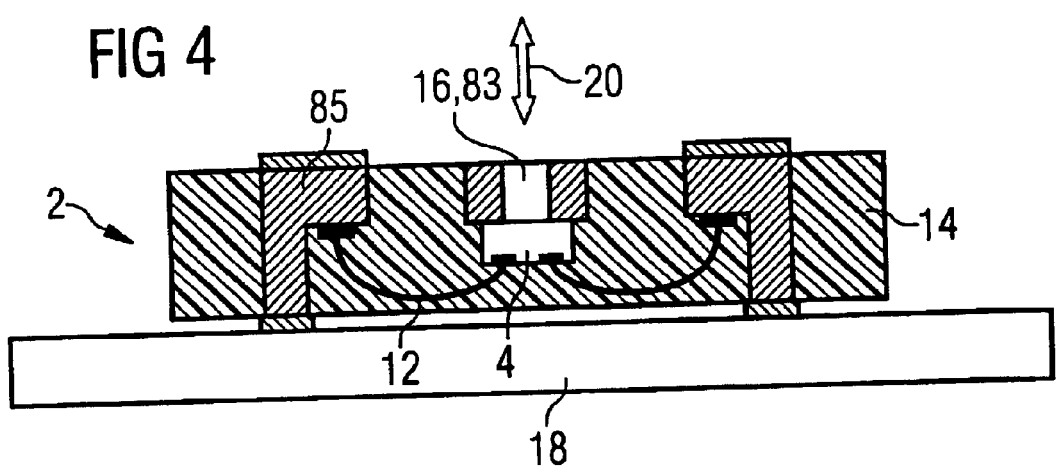

ELECTRONIC SENSOR DEVICE AND METHOD FOR PRODUCING THE ELECTRONIC SENSOR DEVICE

BACKGROUND OF THE INVENTION

FIELD OF THE INVENTION

The invention relates to an electronic sensor device and a method for producing it.

Electronic sensor devices that contain a semiconductor component as an optical or acoustic sensor or as pressure sensor may have a housing in which a coupling-in point for the sensor signals is provided. By way of example, in the case of an optical sensor, the coupling-in point may be configured in the form of a housing opening that is closed off with a transparent cover.

The configuration of such electronic sensor devices is usually configured as a so-called leadframe construction that is provided with a cover. In this case, at least the sensor chip or the sensor component is surrounded by a housing which can be produced for example by encapsulation by molding using a molding compound, in a globe top technique or from underfilling of a flip-chip configuration.

SUMMARY OF THE INVENTION

It is accordingly an object of the invention to provide an electronic sensor device and a method for the producing electronic sensor device, which overcome the above-mentioned disadvantages of the prior art devices and methods of this general type, which is constructed very compactly and can be produced cost-effectively.

With the foregoing and other objects in view there is provided, in accordance with the invention, an electronic sensor device. The electronic sensor device contains an electrically conductive rewiring structure having a bearing base, contact pads, and external contact areas. At least one sensor component has an active front side bearing on the bearing base. The sensor device further has a passive rear side with contact areas electrically conductively connected to the contact pads of the electrically conductive rewiring structure. A housing made of plastic is provided. From the housing, the external contact areas of the electrically conductive rewiring structure lead outward for an electrical contact-connection of the sensor component.

According to the invention, the electronic sensor device has the sensor component, which bears with an active front side on the bearing base of the electrically conductive rewiring structure. Contact areas on a passive rear side of the sensor component are electrically conductively connected to contact pads of the rewiring structure, for example by wire bonding connections. The electronic sensor device furthermore contains a housing made of plastic, from which external contact areas of the rewiring structure are led outward for the electrical contact-connection of the electronic sensor device.

The particular advantage of such an electronic sensor device resides in the compactness that can be achieved for the device and its very small structural height.

One embodiment of the invention provides for the electrically conductive rewiring structure to have a three-dimensional structure, which is associated with considerable advantages with regard to the compactness that can be achieved for the device. The sensor component may be e.g. a simple photodiode or a pressure sensor or the like. Only two bonding wire connections for rewiring are necessary therefor. However, a more highly integrated semiconductor chip having a multiplicity of contact areas may also be used as the sensor component. In this case, the rewiring structure must likewise have a multiplicity of contact pads that are electrically conductively connected to the contact areas of the sensor chip via bonding wire connections or by flip-chip technology.

The electrically conductive layer of the rewiring structure may be formed from aluminum, nickel, gold, silver, palladium and/or copper. All these metals are particularly suited to the production of electrically readily conductive connections with minimal electrical resistance.

A further embodiment of the invention provides for the bearing base of the electrically conductive rewiring structure to have a frame-like or hollow-cylindrical contour with a coupling-in point for sensor signals. In this way, it is possible to enable a simple coupling-in and coupling-out possibility for optical or other sensor signals in a highly planar housing.

In accordance with a further embodiment of the invention, a cavity is formed between the sensor component and the frame of the bearing base, the cavity acting as coupling-in point for sensor signals.

The electronic sensor component is preferably electrically conductively connected to the rewiring structure by bonding connections, which has the advantage of electrical connections that can be produced simply and cost-effectively.

The electronic sensor component of the sensor device may be for example an optical sensor, for example a photodiode, a CCD camera or the like. Equally, an acoustic sensor, for example a microphone, is appropriate as the electronic sensor component. As an alternative, the electronic sensor component may also be a pressure sensor or the like. All these different types of sensors are suitable for realizing a miniaturized sensor device according to the invention.

A method according to the invention for producing an electronic sensor device in accordance with one of the embodiments described above has at least the now described method steps. A thin metallic carrier substrate is provided, whose area corresponds to a plan of an electronic sensor device to be produced. A photofilm layer is subsequently applied on a first surface of the carrier substrate, and is exposed using a mask which images line structures. Afterward, the photofilm layer is developed, the imaged line structures being removed from the photofilm layer. The developed regions of the photofilm layer are filled with an electrically conductive layer, after which the photofilm layer is removed. In this way, a three-dimensional rewiring structure is produced from the electrically conductive layers.

The sensor component is applied with its active front side on a bearing base of the rewiring structure. Wire bonding connections are produced between the contact areas on the passive rear side of the sensor component and contact pads of the rewiring structure. Finally, a housing made of plastic is provided around the sensor component and the rewiring structure, a cavity being left free within the hollow bearing base. The carrier substrate is finally removed with external contact areas of the electronic sensor device being uncovered.

The method according to the invention has the advantage that an extremely compact sensor device that already has all the required contacts can thus be produced in a rapid and efficient manner. The sensor device is suitable in particular for mounting on a printed circuit board or the like.

In accordance with a first refinement of the method according to the invention, essentially aluminum, nickel, silver, gold, palladium and/or copper is used for the electrically conductive layer of the rewiring structure; these metals have the advantage of good electrical conductivity.

A further embodiment of the method according to the invention provides for the electrically conductive layer of the rewiring structure to be applied by sputtering and/or vapor deposition. The process of filling with the electrically conductive layer can also be effected, for example, by paste printing or by electrodeposition or chemically. Complex rewiring structures in the electronic sensor device can advantageously be produced very rapidly and simply by the methods mentioned.

In accordance with a further embodiment of the method according to the invention, the metallic carrier substrate is removed by etching or by mechanical abrasion, such as, for example, grinding, after the application of the housing made of plastic. By way of example, copper is appropriate as the metallic carrier substrate. Copper has good thermal and electrical properties and can be removed in a simple manner by etching or grinding after the completion of the housing encapsulation of the device, as a result of which the external contact areas leading from the plastic housing are uncovered.

The housing of the electronic sensor device may advantageously be produced from plastic by transfer molding. This method has the advantage of simple and cost-effective produceability. Moreover, in this case the wire bonding connections are preserved and protected against being torn away. Thus, the entire structure produced, including the sensor component and the bonding wires, can be encapsulated by molding using a commercially available molding compound or globe top or the like.

To summarize, the following aspects of the invention emerge. The method according to the invention provides a housing for sensor devices that, in comparison with customary sensors or optical housings, is cost-effective, very small and can be used flexibly in mounting. In the case of the housing presented here, the often necessary provision of a small cavity for ensuring sensor-technical and optical functions is provided by a technical solution which renders superfluous a cover that is otherwise customary. In this case, numerous advantageous are achieved by the use of a plastic housing without a leadframe. Flexible mounting possibilities emerge on account of a small device size, in particular a small height. Moreover, the device can be mounted in at least two orientations, in which case the terminal for coupling a sensor signal in or out may lie at the top or bottom. The housing can be produced cost-effectively and be used for diverse application in sensor technology.

What is advantageous, inter alia, is the provision of a simple coupling-in and coupling-out possibility for optical or other sensor signals into a highly planar "leadless" housing. In particular, the coupling-in and coupling-out can be integrated without difficulty into the housing manufacturing process. This opens up a broad field of application.

By way of example, the electronic sensor device according to the invention can be produced by the following manufacturing sequence. A first structure is applied on a carrier by phototechnology. The structure contains both the later chip pad, which contains an opening (e.g. a round hole) for coupling optical or other sensor signals in or out, and the basic metallization layer of the later contact pads. Afterward, two or more pillar-shaped structures are coated onto the two external contact pads in a further phototechnology cycle.

The pillars may be terminated with a protective layer (e.g. gold), under certain circumstances, for anticorrosion resistance.

The die bonding and wire bonding are affected in a customary manner. The die bonding process must ensure that a cavity remains between the sensor area of the chip and carrier material during the subsequent encapsulation by injection molding or potting. The encapsulation by injection molding or potting of the structure with a plastic compound leaves contact surfaces uncovered. The latter thus project somewhat from the molding compound. This is possible for example with the customary method of film molding. The carrier is subsequently removed, this being possible, with a copper carrier being used, by selective copper etching, for example. In this case, specific materials (e.g. nickel) are not attacked.

All applications that require a small cavity for ensuring the chip functionality are conceivable. The corresponding chip may thus fulfill for example the following functions. It may be a pressure sensor, a microphone or another mechanical sensor. A camera, a photodiode or a laser is equally appropriate as the sensor component.

Other features which are considered as characteristic for the invention are set forth in the appended claims.

Although the invention is illustrated and described herein as embodied in an electronic sensor device and a method for producing the electronic sensor device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagrammatic, sectional view of an electronic sensor device according to the invention;

FIG. 2 is a diagrammatic, plan view of an underside of the electronic sensor device shown in FIG. 1;

FIG. 3 is a diagrammatic, sectional view of an exemplary mounting of the electronic sensor device according to the invention on a printed circuit board;

FIG. 4 is a diagrammatic, sectional view of an alternative mounting possibility for the electronic sensor device on the printed circuit board.

DESCRIPTION OF THE PREFERRED EMBODIMENTS

Figure 5:
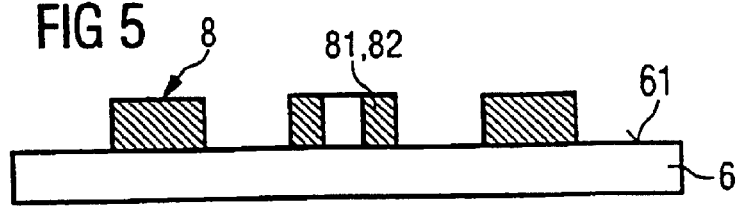
FIGS. 5 to 9 are diagrammatic, sectional views of successive steps of a method according to the invention for producing the electronic sensor device shown in FIGS. 1 to 4.

Referring now to the figures of the drawing in detail and first, particularly, to FIG. 1 thereof, there is shown a diagrammatic sectional view of an electronic sensor device 2 according to the invention. The electronic sensor device 2 contains an electrically conductive rewiring structure 8, a sensor component 4 applied on a bearing base 81 of the rewiring structure 8, and also an encapsulating housing 14. The bearing base 81 has a frame-like structure and encapsulates a cavity 83 with its frame 82. The cavity simultaneously forms a coupling-in point 16 for sensor signals 20.

Consequently, the cavity 83 is not filled with the plastic forming the housing 14, but rather allows the sensor signals 20 to impinge unhindered on the active front side 41 of the sensor component 4.

The rewiring structure 8 furthermore contains at least two pillars 85, which, in the exemplary embodiment shown, pass through from the housing 14 in each case at the top and bottom, where they are provided in each case with external contact areas 86 or external contacts 10. The pillars 85 are electrically conductively connected to contact areas 43 of the sensor component 4 at contact pads 84 in each case by bonding wires 12. The bonding wires 12 are embedded in the housing 14.

Depending on the degree of integration realized for the sensor component 4, the rewiring structure 8 may contain the few constituent parts shown (the pillars 85, the bearing base 81) or else a multiplicity of rewiring lines that may run, if appropriate, in a three-dimensional structure. Thus, a large scale integrated semiconductor chip having a multiplicity of contact areas 43 may also be used as the sensor component 4. In this case, the contact areas 43 are electrically conductively connected to the corresponding contact pads 84 of a large scale integrated rewiring structure 8 via an identical number of the bonding wires 12.

The pillars 85 provided with a respective external contact area 86 at two opposite housing surfaces may—depending on the desired purpose of application and use—if appropriate also only have in each case an external contact 86 (at the top or bottom on the housing 14).

FIG. 2 shows a diagrammatic plan view of an underside of the electronic sensor device 2 in accordance with FIG. 1. The pillars 85 situated in each case in left-hand and right-hand regions of the housing 14 can be discerned here. The pillars 85 made of metal or of an electrically conductive plastic are electrically conductively connected via the bonding wires 12 to the sensor component 4, of which here it is possible to discern only a part of the active front side 41 which is left free by the cavity 83 of the bearing base 81 and which simultaneously represents the coupling-in point 16 for the sensor signals 20. Only two of the possible multiplicity of electrical contacts are illustrated here by way of example.

FIG. 3 shows a further diagrammatic sectional view of an exemplary mounting of the electronic sensor device 2 according to the invention on a printed circuit board 18. In this case, the electronic sensor device 2 is electrically conductively connected to non-illustrated contacts of a conductor track structure on the printed circuit board 18 by the external contact areas 86. In this case, the coupling-in point 16 faces the printed circuit board 18, which must have a feed through for the sensor signal 20. The feed through may preferably be configured in the form of a hole or the like.

FIG. 4 shows an alternative mounting possibility for the electronic sensor device 2, which in this case is mounted with the coupling-in point 16 facing away from the printed circuit board 18.

The method according to the invention for producing the electronic sensor device 2 is illustrated with reference to the diagrammatic illustrations of FIGS. 5 to 9.

FIG. 5 shows a thin metallic carrier substrate 6 made of copper or the like, on which the rewiring structure 8 is already applied. The area of the carrier substrate 6 preferably corresponds to the plan of the electronic sensor device 2 to be produced. A photofilm layer is applied to a first surface 61 of the carrier substrate 6 and is subsequently exposed using a mask that images the desired line structures of the rewiring structure 8. The photofilm layer is developed, the imaged line structures being removed. Afterward, the developed regions are filled with an electrically conductive layer, after which the photofilm layer is removed.

The filling process can be effected, by way of example, by electrodeposition or chemically. Physical methods such as sputtering or vapor deposition are equally suitable. In this way, a three-dimensional rewiring structure 8 is produced from the electrically conductive layers as is illustrated in FIG. 5 in a first process step.

Figure 6:
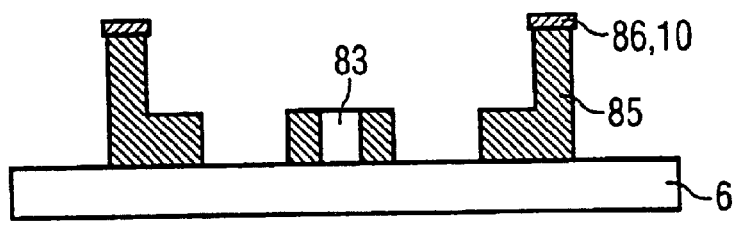

FIG. 6 shows an optional further method step, in which the outer pillars 85 of the rewiring structure 8 are constructed further with thinner structures. The bearing base 81 containing the frame 82 and the cavity 83, the bearing base being disposed between the pillars 85, can furthermore be discerned.

Figure 7:
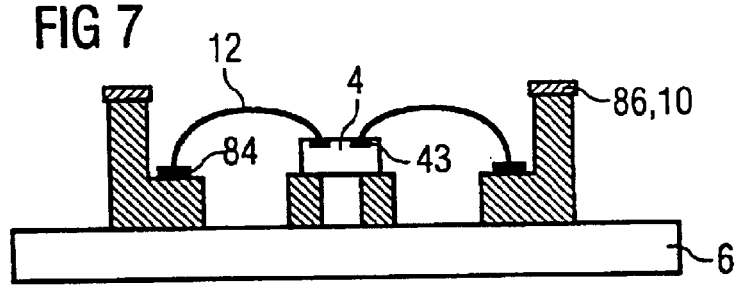
Figure 8:
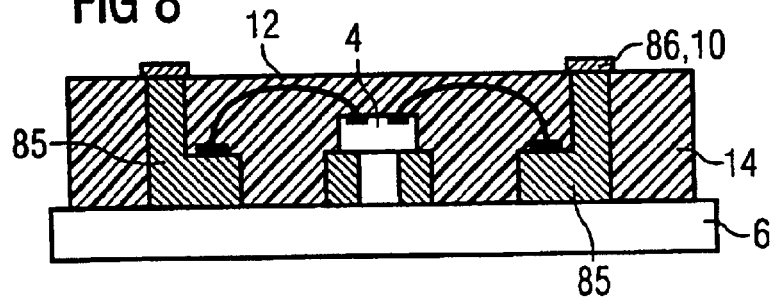

The sensor component 4 is subsequently fixed with its active front side 41 on the bearing base 81 of the rewiring structure 8 by die bonding (see FIG. 7). Wire bonding connections are produced between the contact areas 43 on the passive rear side 42 of the sensor component 4 and the contact pads 84 of the rewiring structure 8. Finally, the housing 14 made of plastic is provided around the sensor component 4 and the rewiring structure 8 with the cavity 83 being left free within the hollow bearing base 81 (see FIG. 8), after which the carrier substrate 6 is removed with external contact areas 86 of the electronic sensor device 4 being uncovered (see FIG. 9).

Figure 9:
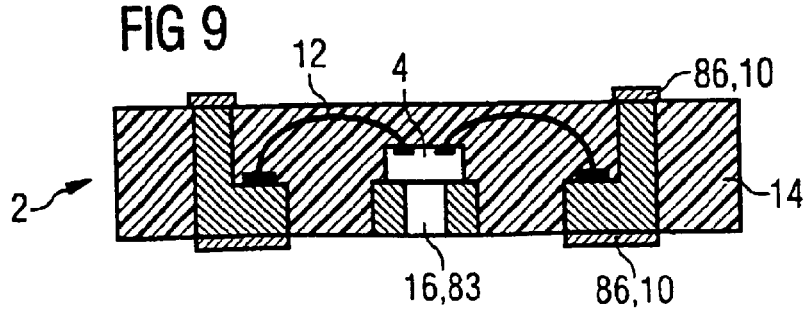

The pillars 85 may optionally be provided with the external contact areas 86 or with the external contacts 10 at the top side and/or at the underside, as is illustrated by way of example in FIG. 9.

We claim:

1. An electronic sensor device, comprising:
    an electrically conductive rewiring structure having a bearing base, contact pads, and external contact areas;
    at least one uncovered sensor component having an active front side bearing on said bearing base and a passive rear side with contact areas electrically conductively connected to said contact pads of said electrically conductive rewiring structure;
    said bearing base having a contour selected from the group consisting of a frame and a hollow cylindrical shape, said contour defining a coupling-in point for sensor signals;
    said at least one uncovered sensor component and said contour defining a cavity formed between said at least one uncovered sensor component and said contour of said bearing base; and
    a housing made of plastic, and from said housing said external contact areas of said electrically conductive rewiring structure lead outward for an electrical contact-connection of said at least one uncovered sensor component.

2. The electronic sensor device according to claim 1, wherein said electrically conductive rewiring structure has a three-dimensional structure.

3. The electronic sensor device according to claim 1, wherein said sensor component is an optical sensor.

4. The electronic sensor device according to claim 1, wherein said sensor component is an acoustic sensor.

5. The electronic sensor device according to claim 1, wherein said sensor component is a pressure sensor.

6. A method for producing an electronic sensor device, which comprises the steps of:
    providing a thin metallic carrier substrate having an area corresponding to a plan of the electronic sensor device to be produced;

applying a photofilm layer on a surface of the thin metallic carrier substrate;

exposing the photofilm layer using a mask for imaging line structures;

developing the photofilm layer resulting in the line structures being removed from the photofilm layer resulting in developed regions;

filling the developed regions with an electrically conductive layer;

removing the photofilm layer resulting in a three-dimensional rewiring structure being formed from the electrically conductive layers;

applying a sensor component having an active front side on a hollow bearing base of the three-dimensional rewiring structure;

producing wire bonding connections between contact areas on a passive rear side of the component and contact pads of the three-dimensional rewiring structure;

providing a housing made of plastic around the sensor component and the three-dimensional rewiring structure, with a cavity being left free within the hollow bearing base; and removing the thin metallic carrier substrate with external contact areas of the three-dimensional rewiring structure being uncovered.

7. The method according to claim 6, which comprises forming the thin metallic carrier substrate from copper.

8. The method according to claim 6, which comprises using at least one metal selected from the group consisting of aluminum, nickel, silver, gold, palladium and copper for the electrically conductive layer of the three-dimensional rewiring structure.

9. The method according to claim 6, which comprises applying the electrically conductive layer for the three-dimensional rewiring structure by at least one of sputtering and vapor deposition.

10. The method according to claim 6, which comprises applying the electrically conductive layer of the three-dimensional rewiring structure by one of electroplating and chemical coating.

11. The method according to claim 6, which comprises removing the thin metallic carrier substrate by etching after an application of the housing made of plastic.

12. A method for producing an electronic sensor device, which comprises the steps of:

forming an electrically conductive rewiring structure having a bearing base with a contour selected from the group consisting of a frame and a hollow cylindrical shape, contact pads, and external contact areas;

defining a coupling-in point for sensor signals;

placing at least one sensor component having an active uncovered front side on the bearing base, the sensor component having a passive rear side with contact areas electrically conductively connected to the contact pads of the electrically conductive rewiring structure;

defining a cavity formed between the contour of the bearing base and the at least one sensor;

impinging sensor signals unhindered on the active uncovered front side of the at least one sensor on the bearing base; and forming a housing made of plastic encasing, outside of the cavity, the electrically conductive rewiring structure and the sensor component, and extending from the housing, the external contact areas of the electrically conductive wiring structure lead outward for an electrical contact-connection of the sensor component.

* * * * *